United States Patent
Coutts

(10) Patent No.: US 9,367,054 B2
(45) Date of Patent: Jun. 14, 2016

(54) SIZING POWER-GATED SECTIONS BY CONSTRAINING VOLTAGE DROOP

(71) Applicant: QUALCOMM Incorporated, San Diego, CA (US)

(72) Inventor: Ryan Michael Coutts, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 375 days.

(21) Appl. No.: 14/157,503

(22) Filed: Jan. 16, 2014

(65) Prior Publication Data

US 2015/0198933 A1    Jul. 16, 2015

(51) Int. Cl.
| | | |
|---|---|---|
| G05B 13/02 | (2006.01) | |
| H03K 17/687 | (2006.01) | |
| G01R 27/26 | (2006.01) | |
| G01R 21/00 | (2006.01) | |
| G01R 19/00 | (2006.01) | |
| H03K 19/00 | (2006.01) | |
| H03K 19/003 | (2006.01) | |
| G05F 1/56 | (2006.01) | |

(52) U.S. Cl.
CPC ........ *G05B 13/0205* (2013.01); *G01R 19/0084* (2013.01); *G01R 21/006* (2013.01); *G01R 27/2605* (2013.01); *H03K 17/687* (2013.01); *H03K 19/0016* (2013.01); *H03K 19/00315* (2013.01); *Y10T 307/76* (2015.04)

(58) Field of Classification Search
CPC ........................................................ G05F 1/56
USPC .......................................................... 307/52
See application file for complete search history.

(56) References Cited

U.S. PATENT DOCUMENTS

| | | | |
|---|---|---|---|
| 7,755,396 | B2 | 7/2010 | Shin et al. |
| 8,266,569 | B2 | 9/2012 | Palisetti et al. |
| 8,302,059 | B2 | 10/2012 | Pineda de Gyvez et al. |
| 2008/0066035 | A1 | 3/2008 | Asao |
| 2009/0219083 | A1 | 9/2009 | Kawasaki |
| 2013/0099570 | A1 | 4/2013 | Manohar et al. |

FOREIGN PATENT DOCUMENTS

EP         2369509 A1    9/2011

OTHER PUBLICATIONS

International Search Report and Written Opinion—PCT/US2015/011762—ISA/EPO—Apr. 16, 2015.

*Primary Examiner* — Robert Deberadinis
(74) *Attorney, Agent, or Firm* — Loza & Loza LLP

(57) ABSTRACT

A method for powering up a circuit comprising a plurality of sections of progressively increasing size is described. The method comprises receiving a signal for powering up the circuit, and, in response to the signal, sequentially powering up the plurality of sections in an order of increasing size.

30 Claims, 7 Drawing Sheets

SIZING POWER-GATED SECTIONS BY CONSTRAINING VOLTAGE DROOP

BACKGROUND

1. Field

Aspects of the present disclosure relate generally to power gating, and more particularly, to sizing power-gated sections by constraining voltage droop.

2. Background

A power distribution network (PDN) may be used to distribute power from a power supply (e.g., a battery) to various circuits on a die. To conserve power, the PDN may employ powering gating, in which the PDN disconnects a circuit from the power supply when the circuit is inactive to prevent power leakage from the circuit. As the dimensions of circuits scale down into the deep nanometer range, power leakage significantly increases. Therefore, power gating is becoming increasing important to reduce power consumption and extend the battery life of mobile devices.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for sizing power-gated sections in a downstream circuit is described herein. The method comprises determining a capacitance for a first section based on a capacitance of an upstream circuit, and a voltage-droop constraint, determining a capacitance for a second section based on the capacitance of the upstream circuit, the voltage-droop constraint, and the determined capacitance for the first section, and determining a capacitance for a third section based on the capacitance of the upstream circuit, the voltage-droop constraint, and the determined capacitances for the first and second sections. The method also comprises determining a size for each of the first, second and third sections based on the determined capacitance for each of the sections.

A second aspect relates to a method for powering up a circuit comprising a plurality of sections of progressively increasing size. The method comprises receiving a signal for powering up the circuit, and, in response to the signal, sequentially powering up the plurality of sections in an order of increasing size.

A third aspect relates to an apparatus for powering up a circuit comprising a plurality of sections of progressively increasing size. The apparatus comprises means for receiving a signal for powering up the circuit, and means for sequentially powering up the plurality of sections in an order of increasing size in response to the signal.

A fourth aspect relates to an apparatus for powering up a circuit comprising a plurality of sections of progressively increasing size. The apparatus comprises a plurality of switches, wherein each of the switches is configured to selectively connect a respective one of the sections to a power rail. The apparatus also comprises a power management device configured to sequentially close the switches such that the switches sequentially power up the plurality of sections in an order of increasing size.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
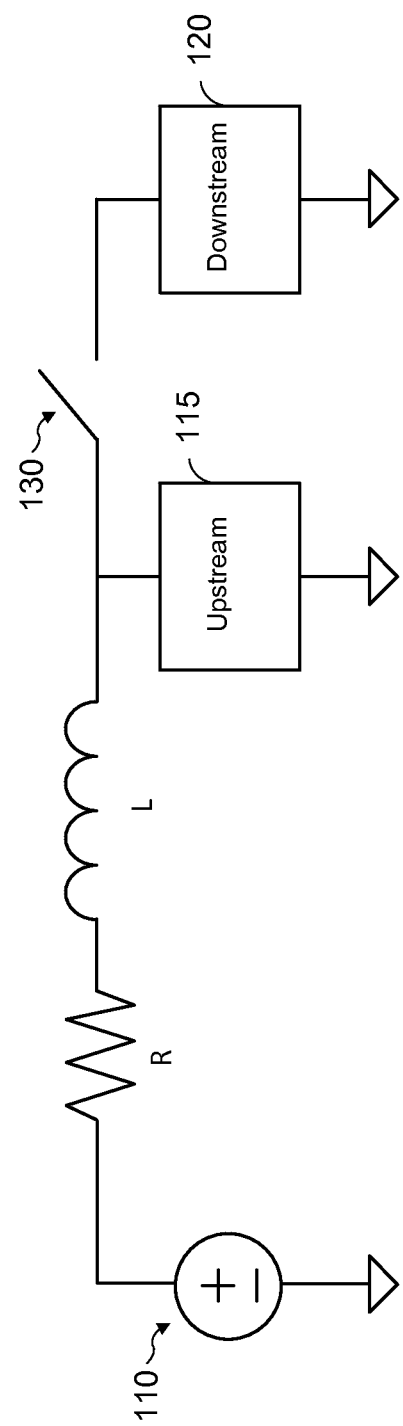
FIG. 1 shows an example of a power distribution network (PDN) for distributing power to an upstream circuit and a downstream circuit.

FIG. 1 shows an example of a power distribution network (PDN) for distributing power from a DC power supply 110 to an upstream circuit 115 and a downstream circuit 120. The inductor L and the resistor R in FIG. 1 model inductance and resistance, respectively, of board and packaging interconnects between the power supply 110 and the circuits 115 and 120. The upstream circuit 115 and the downstream circuit 120 may be located on the same die.

The PDN may employ power gating to conserve power. In this regard, the PDN includes a power switch 130 for selectively connecting the downstream circuit 120 to the power supply 110. When the downstream circuit 120 is active, the power switch 130 is turned on to supply power to the downstream circuit 120, and when the downstream circuit 120 is inactive, the power switch 130 is turned off to disconnect the power supply 110 from the downstream circuit 120. This reduces power leakage from the downstream circuit 120 when the downstream circuit 120 is inactive, thereby conserving power.

It is desirable for the power switch 130 to have very low resistance when the downstream circuit 120 is active to minimize the IR voltage drop across the power switch 130. However, this can lead to a large droop in the supply voltage at the upstream circuit 115 when the power switch 130 is first closed, potentially causing logic in the upstream circuit 115 to malfunction. The large voltage droop is caused by capacitors in the downstream circuit 120. The capacitors may include parasitic metal-line capacitors and parasitic capacitors in transistors of the downstream circuit 120. The capacitors in the downstream circuit 120 have approximately no charge when the downstream circuit 120 is first awakened from the inactive state. As a result, when the upstream circuit 115 and the downstream circuit 120 are initially connected by the power switch 130, a large amount of charge quickly flows from capacitors in the upstream circuit 115 to capacitors in the downstream circuit 120, causing the supply voltage at the upstream circuit 115 to droop. The PDN is not able to supply charge fast enough to prevent the voltage droop due to the inductance in the PDN.

The size of the voltage droop may be approximated by the following equation:

$$\text{Droop} = \left(1 - \frac{C_{up}}{C_{up} + C_{dn}}\right) \quad (1)$$

where $C_{up}$ is a capacitance of the upstream circuit 115, $C_{dn}$ is a capacitance of the downstream circuit 120, and Droop represents a percentage drop in the supply voltage at the upstream circuit 115 due to voltage droop. For example, a Droop of 0.10 represents a 10% drop in the supply voltage. Equation (1) assumes an ideal power switch 130 having zero on resistance.

As can be seen from equation (1), the voltage droop can be large when the capacitance of the downstream circuit 120 is large relative to the capacitance of the upstream circuit 115. For example, when $C_{up}$ and $C_{dn}$ are approximately equal, the Droop is approximately 0.5 (i.e., 50% of the supply voltage), which is unacceptably high in most cases.

Figure 2:
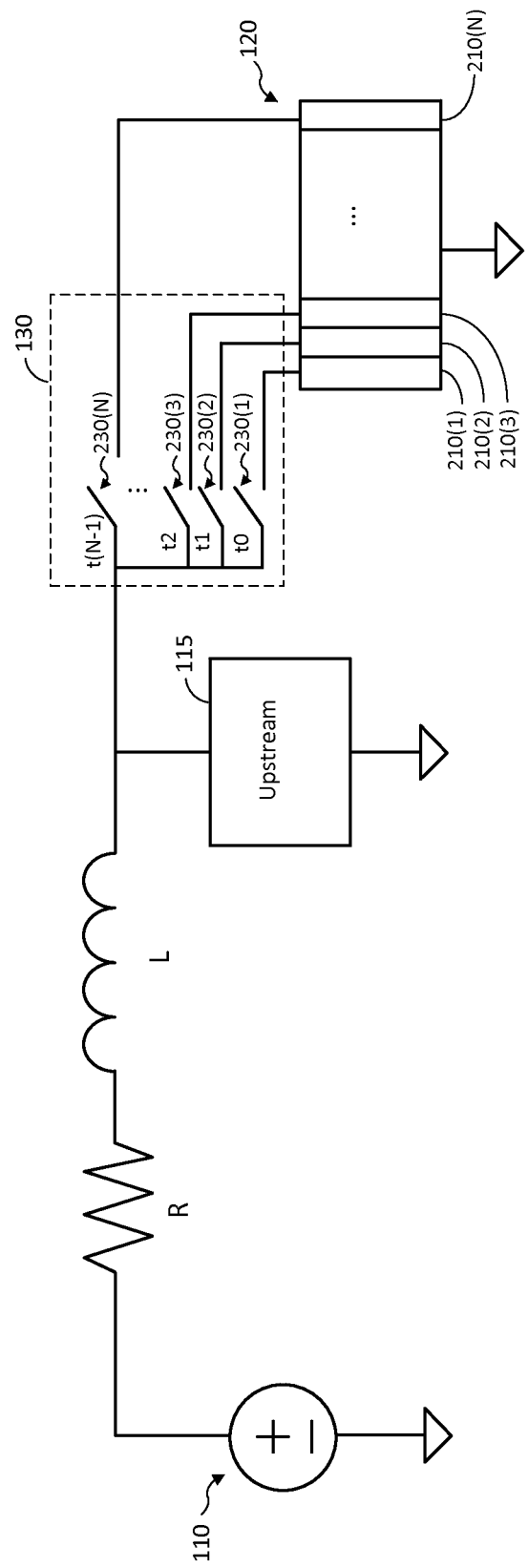
FIG. 2 shows an example of a downstream circuit divided into a plurality of equally-sized sections.

One approach to keep the voltage droop within acceptable limits is to divide the downstream circuit 120 into a plurality of sections (power domains), and power up the sections of the downstream circuit 120 sequentially instead of powering up the entire downstream circuit 120 at once. In this regard, FIG. 2 shows an example in which the downstream circuit 120 is divided into N equally-sized sections 210(1)-210(N), and the power switch 130 comprises N switches 230(1)-230(N). Each switch 230(1)-230(N) is configured to selectively connect a respective one of the sections 210(1)-210(N) to the power supply 110. This allows each section 210(1)-210(N) of the downstream circuit 120 to be powered up separately.

When the downstream circuit 120 is inactive, all of the switches 230(1)-230(N) are open to reduce power leakage. When the downstream circuit 120 is to be awakened from the inactive state, the switches 230(1)-230(N) are sequentially turned on to sequentially power up the sections 210(1)-210(N) of the downstream circuit 120. The first switch 230(1) is turned on at time t0, the second switch 230(2) is turned on at time t1, the third switch 230(3) is turned on at time t2, and so forth until the Nth switch 230(N) is turned on at time t(N−1). The time delay between adjacent switches may be chosen such that, when one of the switches is turned on, the next switch is not turned on until the upstream circuit 115 has had sufficient time to settle back to the nominal supply voltage.

Thus, when the downstream circuit 120 is to be awakened, the switches 230(1)-230(N) are sequentially turned on to sequentially power up the sections 210(1)-210(N) of the downstream circuit 120 instead of powering up the entire downstream circuit 120 at once. Each section 210(1)-210(N) only has a small portion of the capacitance of the downstream circuit 120. Thus, each time a switch 230(1)-230(N) is turned on, only a small portion of the capacitance of the downstream circuit 120 needs to be charged up, resulting in a much smaller voltage droop.

A drawback of this approach is that sequentially powering up the sections 210(1)-210(N) of the downstream circuit 120 increases the wakeup time of the downstream circuit 120. Accordingly, a technique for optimizing the sizes of the sections to reduce the wakeup time of the downstream circuit while still staying within a voltage-droop constraint would be desirable.

Embodiments of the present disclosure provide techniques for sizing power-gated sections of a downstream circuit to reduce the wakeup time while still staying within a voltage-droop constraint, as discussed further below.

Equation (1) above may be rewritten to express the downstream capacitance $C_{dn}$ as a function of the upstream capacitance $C_{up}$ and Droop as follows:

$$C_{dn} = \left(\frac{\text{Droop} * C_{up}}{1 - \text{Droop}}\right). \quad (2)$$

Equation (2) can be used to determine a downstream capacitance $C_{dn}$ for a given upstream capacitance $C_{up}$ and voltage-droop constraint by setting Droop in equation (2) equal to the voltage-droop constraint. For example, for a voltage-droop constraint of 0.05 (i.e., 5% of the supply voltage), the downstream capacitance $C_{dn}$ is approximately equal to $0.05263 * C_{up}$.

Equation (2) can be extended to determine a capacitance for each section of a downstream circuit 120 as follows:

$$C_{dn}(n) = \left(\frac{\text{Droop} * \left(C_{up} + \sum_{m=1}^{m=n-1} C_{dn}(m)\right)}{1 - \text{Droop}}\right) \quad (3)$$

where $C_{dn}(n)$ is the capacitance for the nth section of the downstream circuit 120, $C_{up}$ is the capacitance of the upstream circuit 115, and $\sum_{m=1}^{m=n-1} C_{dn}(m)$ is the sum of the capacitances of the previous sections of the downstream circuit 120. Thus, the capacitances of the previous sections are included as part of the total upstream capacitance in equation (3). This is because, by the time the switch for the nth section of the downstream circuit 120 is turned on, the previous sections of the downstream circuit 120 have already been charged up to the supply voltage. As a result, the charges on the capacitances of the previous sections are available to help charge up the capacitance of the nth section. Thus, the capacitances of the previous sections are upstream relative to the nth section, and are therefore included as part of the total upstream capacitance in equation (3).

As can been seen from equation (3), the capacitance for each section progressively increases as more sections are powered up. This is because the total upstream capacitance in equation (3) (i.e., $C_{up} + \sum_{m=1}^{m=n-1} C_{dn}(m)$) increases as more sections are powered up. Thus, equation (3) demonstrates that the sections of the downstream circuit 120 can progressively increase in size while still staying within the specified voltage-droop constraint (e.g., 0.05). The size for each section may be computed by dividing the determined capacitance for the section by a capacitance density (capacitance per unit area) of the downstream circuit 120. Because the sections progressively increase in size, the number of sections that need to be powered up decreases, thereby reducing wakeup time.

Figure 3:
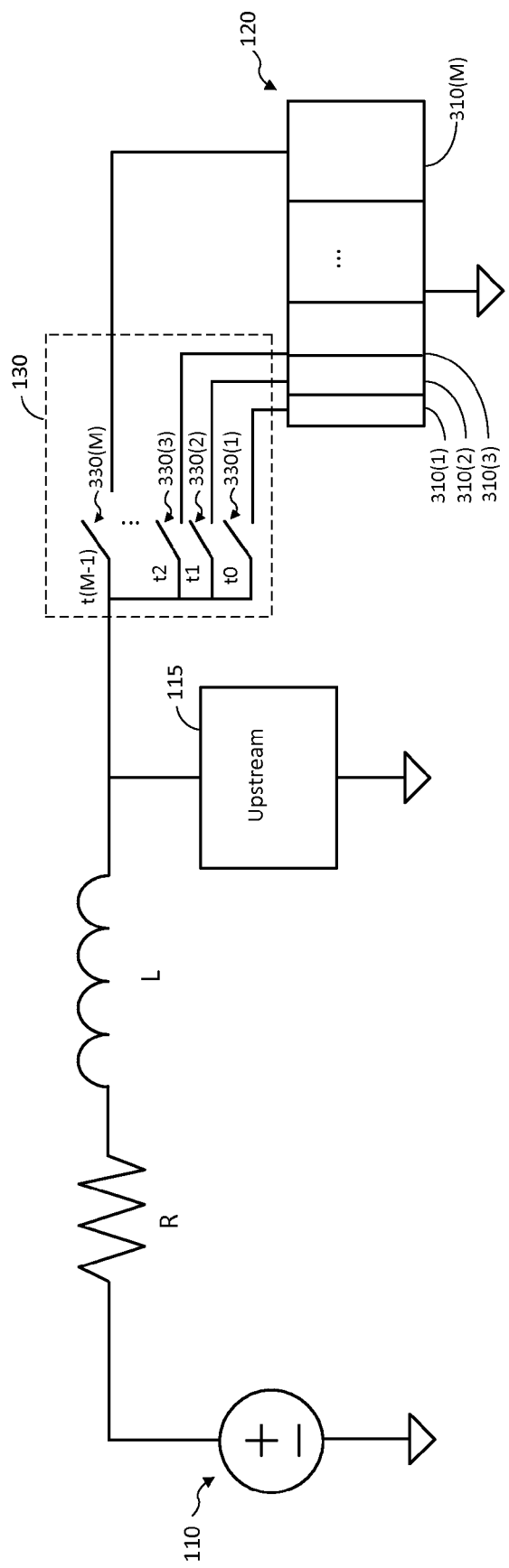
FIG. 3 shows a downstream circuit divided into a plurality of sections that progressively increase in size according to an embodiment of the present disclosure.

FIG. 3 shows the downstream circuit 120 divided into a plurality of sections 310(1)-310(M) that progressively increase in size according to an embodiment of the present disclosure. The sections 310(1)-310(M) progressively increase in size because the effective upstream capacitance increases as more sections are powered up, as discussed above. The power switch 130 comprises M switches 330(1)-330(M), where each switch 330(1)-330(M) is configured to selectively connect a respective one of the sections 310(1)-310(M) to the power supply 110.

When the downstream circuit 120 is to be awakened from the inactive state, the switches 330(1)-330(M) sequentially power up the sections 310(1)-310(M) of the downstream circuit 120 in an order of increasing size (i.e., from the smallest section 310(1) to the largest section 310(M)). Progressively increasing the sections 310(1)-310(M) in size reduces the number of sections that need to be powered up during the power-up sequence compared with using equally-sized sections, and therefore reduces the wakeup time of the downstream circuit 120.

Equation (3) can be used in an iterative process to determine the sizes of power-gated sections 310(1)-310(M) of a downstream circuit 120 according to an embodiment of the present disclosure. In a first iteration, the capacitance $C_{dn}(1)$ for the first section 310(1) of the downstream circuit 120 is determined using equation (3) based on the capacitance $C_{up}$ of the upstream circuit 115 and the voltage-droop constraint. For the first iteration, equation (3) is equivalent to equation (2) since there are no previous sections. For the example where the voltage-droop constraint is 0.05, the capacitance $C_{dn}(1)$ of the first section 310(1) is approximately $0.05263*C_{up}$. After the capacitance $C_{dn}(1)$ of the first section 310(1) is determined, the size of the first section 310(1) may be determined by dividing the capacitance $C_{dn}(1)$ of the first section 310(1) by a capacitance density (capacitance per unit area) of the downstream circuit 120.

In a second iteration, the capacitance $C_{dn}(2)$ for the second section 310(2) of the downstream circuit 120 is determined using equation (3) based on the capacitance $C_{up}$ of the upstream circuit 115, the capacitance $C_{dn}(1)$ of the first section 310(1) (previous section), and the voltage-droop constraint. For the example where the voltage-droop constraint is 0.05, the capacitance $C_{dn}(2)$ of the second section 310(2) is approximately $0.0554*C_{up}$. Thus, the capacitance $C_{dn}(2)$ of the second section 310(2) is greater than the capacitance $C_{dn}(1)$ of the first section 310(1). After the capacitance $C_{dn}(2)$ of the second section 310(2) is determined, the size of the second section 310(2) may be determined by dividing the capacitance $C_{dn}(2)$ of the second section 310(2) by the capacitance density of the downstream circuit 120. Since the capacitance $C_{dn}(2)$ of the second section 310(2) is greater than the capacitance $C_{dn}(1)$ of the first section 310(1), the size of the second section 310(2) is larger than the size of the first section 310(1) (assuming a relatively uniform capacitance density).

In a third iteration, the capacitance $C_{dn}(3)$ for the third section 310(3) of the downstream circuit 120 is determined using equation (3) based on the capacitance $C_{up}$ of the upstream circuit 115, the sum of the capacitances $C_{dn}(1)$ and $C_{dn}(2)$ of the first and second sections 310(1) and 310(2) (previous sections), and the voltage-droop constraint. For the example where the voltage-droop constraint is 0.05, the capacitance $C_{dn}(3)$ of the third section is approximately $0.0583*C_{up}$. Thus, the capacitance $C_{dn}(3)$ of the third section 310(3) is greater than the capacitance of each of the first and second sections 310(1) and 310(2). After the capacitance $C_{dn}(3)$ of the third section 310(3) is determined, the size of the third section 310(3) may be determined by dividing the capacitance $C_{dn}(3)$ of the third section 310(3) by the capacitance density of the downstream circuit 120. Since the capacitance $C_{dn}(3)$ of the third section 310(3) is greater than the capacitance of each of the first and second sections 310(1) and 310(2), the size of the third section 310(3) is larger than the size of each of the first and second sections 310(1) and 310(2) (assuming a relatively uniform capacitance density).

The sizes of subsequent sections 310(4)-310(M) may be determined by performing additional iterations, in which the capacitance of each subsequent section is determined using equation (3) based on the capacitance $C_{up}$ of the upstream circuit 115, the sum of the capacitances of the previous sections, and the voltage-droop constraint. The size of each subsequent section is determined by dividing the determined capacitance for the subsequent section by the capacitance density. Because the sum of the capacitances of the previous sections increases in each iteration, the capacitance (and hence size) increases in each iteration.

The iterative process may continue until the sum of the sizes of the sections covers the entire area of the downstream circuit 120. When the iterative process stops, the number of iterations equals the number of sections (power domains) in the downstream circuit since each iteration corresponds to one section. Thus, the iterative process may also be used to determine the number (i.e., M) of sections into which the downstream circuit 120 is to be divided.

The sum of the sizes of the sections determined by the iterative process may be slightly greater than the area of the downstream circuit 120. For example, the sum of the sizes of sections 310(1)-310(M−1) may be slightly less than the area of the downstream circuit 120 while the sum of the sizes of sections 310(1)-310(M) may be slightly greater than the area of the downstream circuit 120. In this case, the sizes of the sections 310(1)-310(M) may be proportionally reduced by a small amount in order to fit the sum of the sizes of the sections 310(1)-310(M) to the area of the downstream circuit 120.

Figure 4:
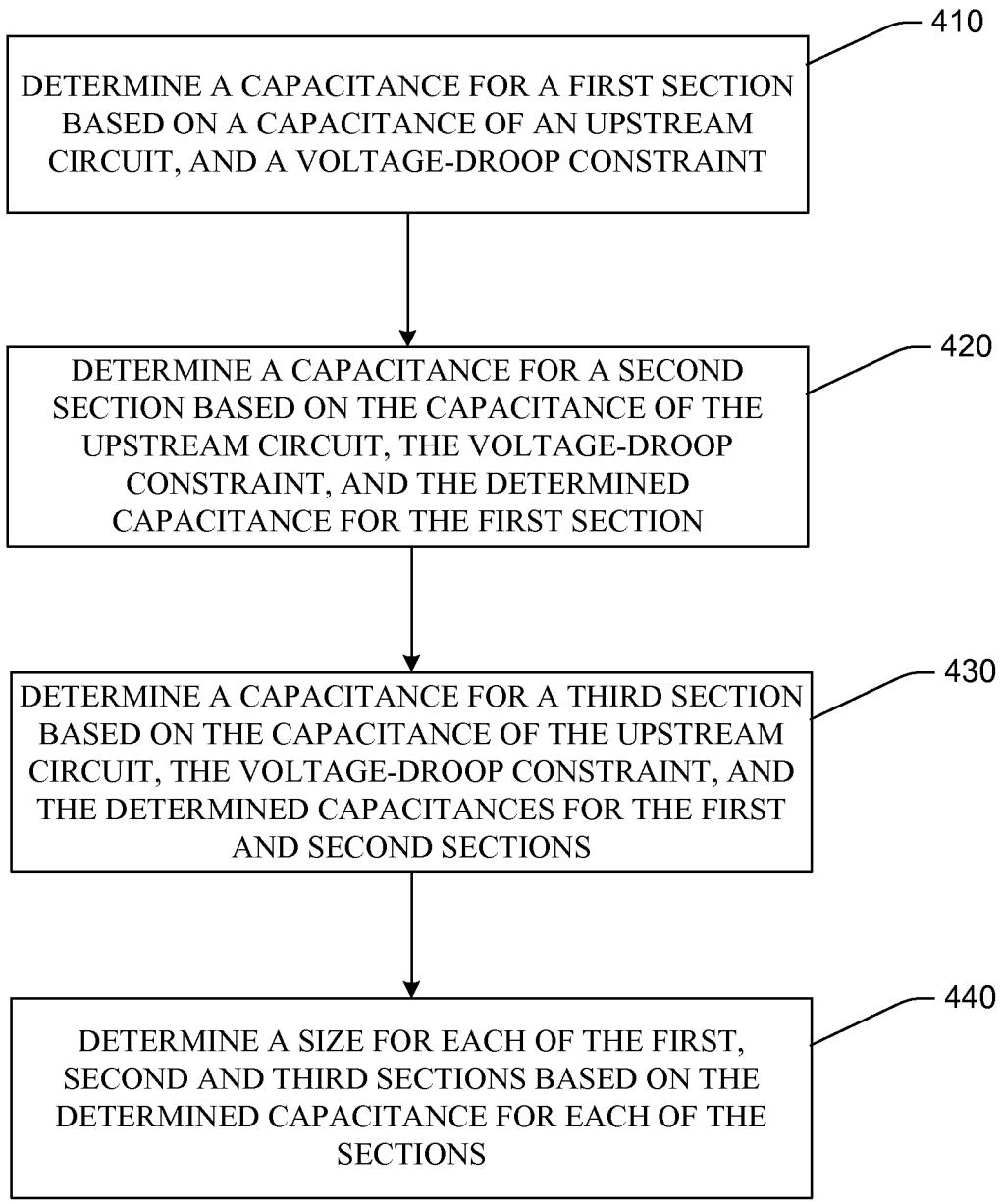
FIG. 4 is a flow diagram showing a method for sizing power-gated sections in a downstream circuit according to an embodiment of the present disclosure.

FIG. 4 shows a method 400 for sizing power-gated sections in a downstream circuit according to an embodiment of the present disclosure.

In step 410, a capacitance for a first section is determined based on a capacitance of an upstream circuit, and a voltage-droop constraint. For example, the capacitance (e.g., $C_{dn}(1)$) for the first section (e.g., 310(1)) may be determined using equation (3).

In step 420, a capacitance for a second section is determined based on the capacitance of the upstream circuit, the voltage-droop constraint, and the determined capacitance for the first section. For example, the capacitance (e.g., $C_{dn}(2)$) for the second section (e.g., 310(2)) may be determined using equation (3), in which the effective upstream capacitance in equation (3) is the sum of the capacitance of the upstream circuit (e.g., upstream circuit 115) and the capacitance for the first section.

In step 430, a capacitance for a third section is determined based on the capacitance of the upstream circuit, the voltage-droop constraint, and the determined capacitances for the first and second sections. For example, the capacitance (e.g., $C_{dn}(3)$) for the third section (e.g., 310(3)) may be determined using equation (3), in which the effective upstream capacitance in equation (3) is the sum of the capacitance of the upstream circuit (e.g., upstream circuit 115) and the capacitances for the first section and second sections.

In step 440, a size for each of the first, second and third sections is determined based on the determined capacitance for each of the sections. For example, the size of each section may be determined by dividing the determined capacitance for the section by a capacitance density of the downstream circuit.

As discussed above, equation (1) for determining voltage droop assumes an ideal power switch having zero resistance when the switch is closed (i.e., zero on resistance). As a result, equation (1) assumes that the voltage droop is due to an instantaneous transfer of charge from capacitors in the upstream circuit 115 to capacitors in downstream capacitor 120 when the switch is closed with no charge contribution from the power supply 110. The reason there is no charge contribution from the power supply 110 in equation (1) is that the inductance in the PDN prevents the power supply 110 from instantaneously supplying charge to the upstream circuit 115.

In practice, a power switch may have a small amount of resistance when the switch is closed. The resistance of the switch and the capacitance of the downstream circuit 120 form an RC time constant that causes charge to be transferred from upstream circuit 115 to the downstream circuit 120 over a period of time. This gives the power supply 110 time to supply charge to the upstream circuit 115 to reduce the voltage droop. As a result, the actual voltage droop is less than the voltage droop predicted by equation (1).

Even so, the voltage droop predicted by equation (1) provides a good approximation of the actual voltage droop when the resistance of the switch is low. This is because, when the resistance of the switch is low, the RC time constant is much smaller than a time constant associated with the PDN inductance (e.g., board and packaging inductance) between the power supply 110 and the upstream circuit 115. As a result, the transfer of charge from the upstream circuit 115 to the downstream circuit 120 is much faster than the transfer of charge from the power supply 110 to the upstream circuit 115, in which case, the voltage droop predicted by equation (1) is relatively close to the actual voltage droop.

As discussed above, the voltage droop determined using equation (1) is less than the actual voltage droop because equation (1) assumes an ideal switch with zero on resistance. Equation (1) may be modified to take the resistance of the switch into account by multiplying the expression for the voltage droop by a correction factor as follows:

$$\text{Droop} = \left(1 - \frac{C_{up}}{C_{up} + C_{dn}}\right) * f \qquad (4)$$

where f is the correction factor. The correction factor f is less than one since the actual voltage droop is less than the voltage droop determined by equation (1). For example, the correction factor may have a value between 0.8 and 0.9. The lower the on resistance of the switch, the closer the switch approximates an ideal switch having zero on resistance, and the closer the correction factor is to one. The correction factor f may be determined by comparing voltage droops determined using equation (1) with voltage-droop obtained from measurements of physical devices and/or circuit simulations.

Equation (2) for determining downstream capacitance $C_{dn}$ may be modified based on equation (4) as follows:

$$C_{dn} = \left(\frac{\frac{1}{f} * \text{Droop} * C_{up}}{1 - \frac{1}{f} * \text{Droop}}\right). \qquad (5)$$

Since the correction factor f is less than one, equation (5) determines a larger downstream capacitance $C_{dn}$ for a given voltage-droop constraint and upstream capacitance $C_{up}$ than equation (2). Equation (3) for determining the capacitance of a section of a downstream circuit 120 may be modified in a similar manner as follows:

$$C_{dn}(n) = \left(\frac{\frac{1}{f} * \text{Droop} * \left(C_{up} + \sum_{m=1}^{m=n-1} C_{dn}(m)\right)}{1 - \frac{1}{f} * \text{Droop}}\right). \qquad (6)$$

Equation (6) may be used to determine the capacitance $C_{dn}(1)$-$C_{dn}(M)$ for each section 310(1)-310(M) of the downstream circuit 120. For example, equation (6) may be used in the iterative process and/or method 400 discussed above. Equation (6) determines larger capacitances $C_{dn}(1)$-$C_{dn}(M)$ for the sections 310(1)-310(M) of the downstream circuit 120 than equation (3), and therefore larger sizes for the sections.

Figure 5:
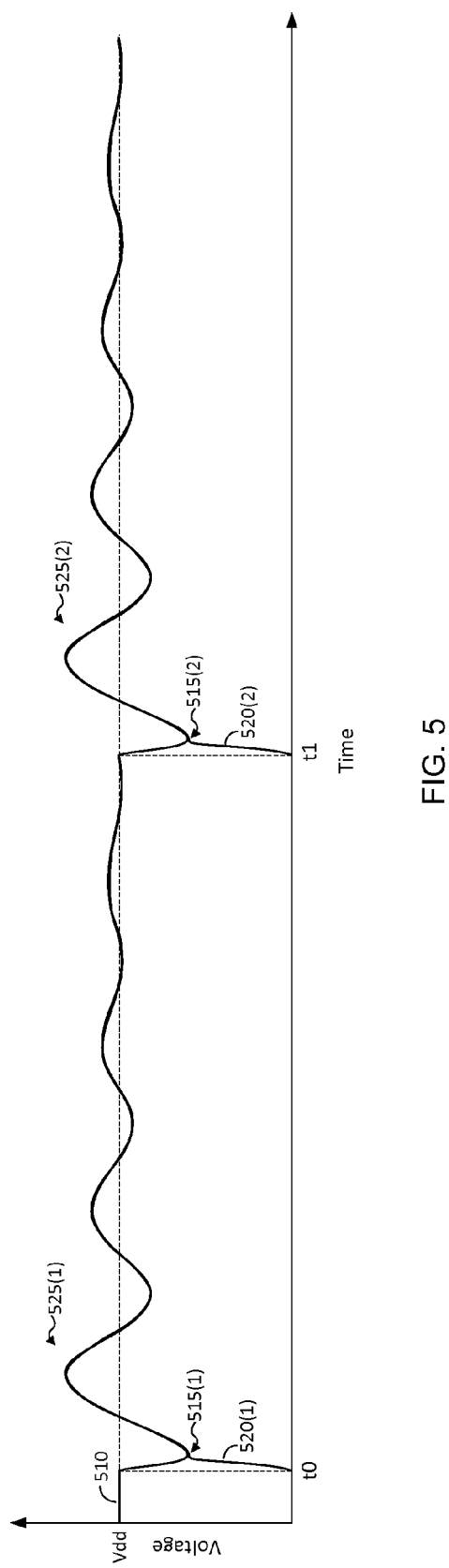
FIG. 5 shows an example of voltage waveforms for an upstream circuit and two sections of a downstream circuit during a power-up sequence according to an embodiment of the present disclosure.

FIG. 5 shows an example of a voltage waveform 510 for the upstream circuit 115 and voltage waveforms 520(1) and 520(2) for the first two sections 310(1) and 310(2) of the downstream circuit 120 during a power-up sequence according to an embodiment of the present disclosure. Before time t0, the voltage of the upstream circuit 115 is approximately equal to the supply voltage Vdd of the power supply 110. Also, before time t0, the downstream circuit 120 is inactive and all of the switches 330(1)-330(M) of the power switch 130 are open. As a result, the voltage of each of the first and section sections 310(1) and 310(2) is approximately zero volts.

At time t0, the switch 330(1) for the first section 310(1) is closed to power up the first section 310(1). This causes charge to quickly flow from capacitors in the upstream circuit 115 to capacitors in the first section 310(1) through the switch 330(1). The transfer of charge quickly reduces the voltage of the upstream circuit 115, resulting in a voltage droop 515(1) at the upstream circuit 115. For a switch having low on resistance, charge from the power supply 110 does not have much of an impact on the voltage droop 515(1) because the inductance of the PDN slows the transfer charge from the power supply 110 to the upstream circuit 115. The voltage droop 515(1) may be bounded by a voltage-droop constraint (e.g., 0.05) by sizing the first section 310(1) according to equation (3) or (6). It is to be appreciated that the size of the voltage droop 515(1) shown in FIG. 5 is exaggerated for ease of illustration.

After the voltage droop 515(1), the voltages of the upstream circuit 115 and the first section 310(1) oscillate, producing a voltage ripple 525(1) on the power rail at the upstream circuit 115 and the first section 310(1). The oscillation is caused by the resonance of an RLC circuit formed by the inductance of the PDN, the capacitance of the upstream circuit 115 and the first section 310(1), and the resistance of the PDN, the upstream circuit 115 and the first section 310(1). The resonance is triggered by the voltage droop 515(1) resulting from the closure of the first switch 330(1). The resonance frequency of the RLC circuit may be approximated by:

$$\omega = \frac{1}{\sqrt{LC}} \quad (7)$$

where ω is the resonance frequency, L includes the inductance of the PDN, and C includes the capacitance of the upstream circuit 115 and the first section 310(1). The ripple 525(1) is dampened by the resistance of the PDN, the upstream circuit 115 and the first section 310(1), which dissipate energy. As a result, the ripple 525(1) dies out over time, and the voltages of the upstream circuit 115 and the first section 310(1) settle to a value close to the supply voltage Vdd.

After a time delay from time t0, the switch 330(2) for the second section 310(2) is closed at time t1 to power up the second section 310(2). In one aspect, the time delay provides sufficient time for the voltages at the upstream circuit 115 and the first section 310(1) to settle to a value close to the supply voltage Vdd (referred to as settling time). For example, the settling time may be the time it takes for the voltage swing of the ripple 525(1) to decrease to a value of less than two percent of the nominal supply voltage. Thus, by the time the switch 330(2) for the second section 310(2) is closed, the upstream circuit 115 and the first section 310(1) have been approximately charged up to the supply voltage Vdd.

At time t1, the switch 330(2) connects the second section 310(2) to the upstream circuit 115 and the first section 310(1), causing charge to quickly flow from capacitors in the upstream circuit 115 and the first section 310(1) to capacitors in the second section 310(2). The transfer of charge quickly reduces the voltages of the upstream circuit 115 and the first section 310(1), resulting in a voltage droop 515(2) at the upstream circuit 115 and the first section 310(1). The voltage droop 515(2) may be bounded by a voltage constraint (e.g., 0.05) by sizing the second section 310(2) according to equation (3) or (6). It is to be appreciated that the size of the voltage droop 515(2) shown in FIG. 5 is exaggerated for ease of illustration.

After the voltage droop 515(2), the voltages of the upstream circuit 115 and the first and second sections 310(1) and 310(2) oscillate, producing a voltage ripple 525(2) on the power rail. The ripple 525(2) dies out over time, and the voltages of the upstream circuit 115 and the first and the second sections 310(1) and 310(2) settle to a value close to the supply voltage Vdd.

After a time delay from time t1, the switch 330(3) for the third section 310(3) is closed to power up the third section 310(3) (not shown in FIG. 5). The time delay may be approximately equal to a settling time of the ripple 525(2) so that, by the time the switch 330(3) for the third section 310(3) is closed, the upstream circuit 115 and the first and the second sections 310(1) and 310(2) have been approximately charged up to the supply voltage Vdd.

Figure 6:
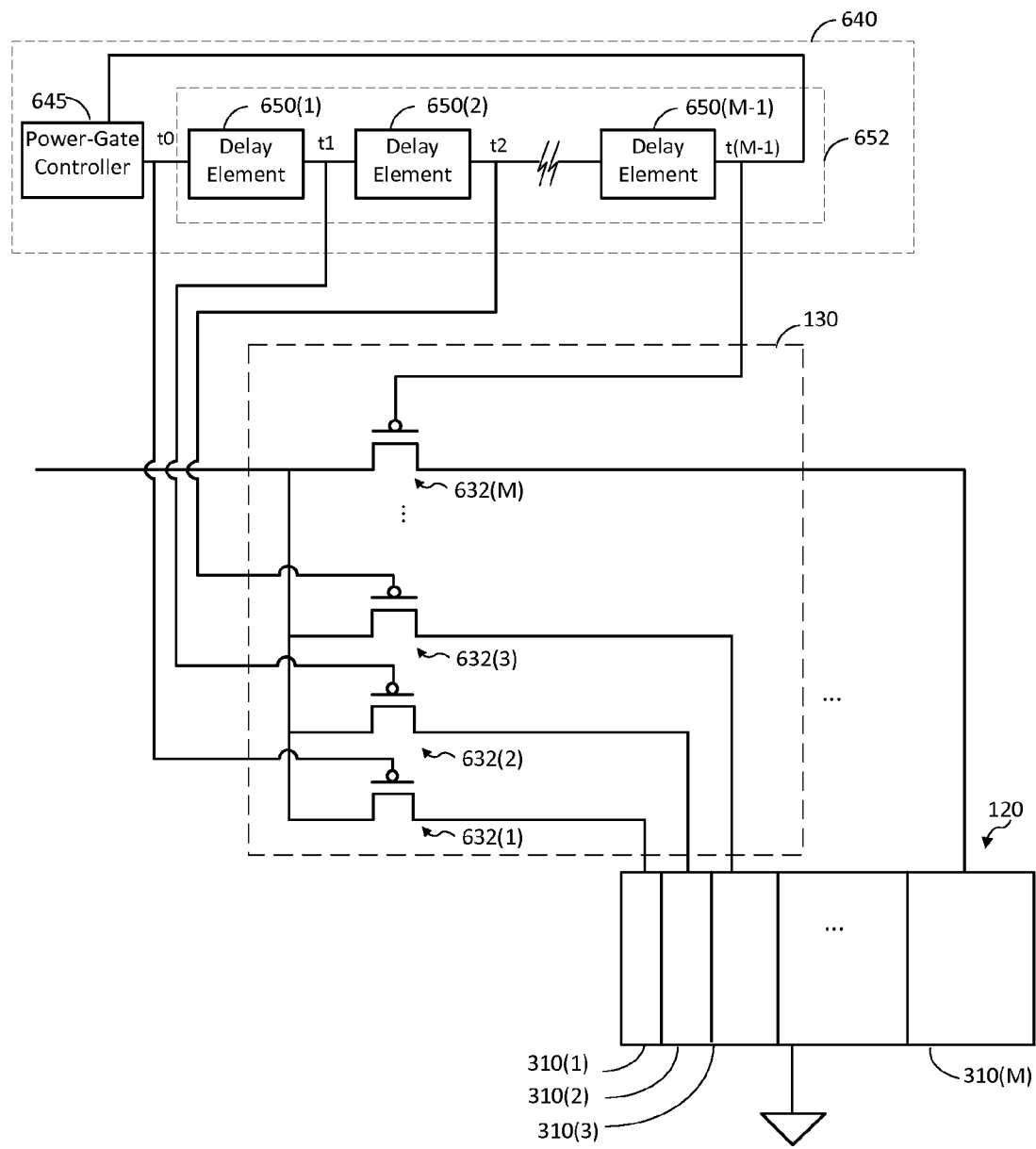
FIG. 6 shows a circuit for sequentially powering up sections of a downstream circuit according to an embodiment of the present disclosure.

FIG. 6 shows an exemplary implementation of the power switch 130 according to an embodiment of the present disclosure. In this embodiment, the switches 632(1)-632(M) for sequentially powering up the sections 310(1)-310(M) of the downstream circuit 120 comprise a plurality of P-type metal-oxide-semiconductor (PMOS) transistor switches. Each PMOS switch 632(1)-632(M) may be opened (turned off) by driving the respective gate high, and closed (turned on) by driving the respective gate low. Although FIG. 6 shows one PMOS switch 632(1)-632(M) for each section 310(1)-310 (M), it is to be appreciated that the power switch 130 may comprise more than one PMOS switch 632(1)-632(M) for each section 310(1)-310(M). For example, the power switch 130 may comprise a plurality of PMOS switches connected in parallel for each section.

In this embodiment, the switches 632(1)-632(M) are controlled by a power management device 640. If the downstream circuit 120 is to enter an inactive state, the power management device 640 may open all of the switches 632(1)-632(M) to disconnect each section 310(1)-310(M) of the downstream circuit 120 from the power supply 110 to reduced power leakage. If the downstream circuit 120 is to be awaken from the inactive state, the power management device 640 may sequentially close (turn on) the switches 632(1)-632 (M) during a power-up sequence to sequentially power up the sections 310(1)-310(M) of the downstream circuit 120. The sections 310(1)-310(M) may progressively increase in size, and the power management device 640 may sequentially close (turn on) the switches 632(1)-632(M) such that the sections 310(1)-310(M) are powered up in an order of increasing size (i.e., from the smallest section 310(1) to the largest section 310(M)).

The power management device 640 comprises a power-gate controller 645 and a plurality of delay elements 650(1)-650(M−1) coupled in series to form a delay chain 652. An output of the power management device 640 is coupled to the gate of the first switch 632(1) and the input of the first delay element 650(1). The output of each of the delay elements 650(1)-650(M−1) is coupled to the gate of a respective one of the switches 632(2)-632(M). More particularly, the output of the first delay element 650(1) is coupled to the gate of the second switch 632(2), the output of the second delay elements 650(2) is coupled to the gate of the third switch 632(3), and so on.

If the downstream circuit 120 is to be awaken from the inactive state, the power-gate controller 645 outputs a power-up signal to the delay chain 652 at time t0 to sequentially turn on the switches 632(1)-632(M). For example, the downstream circuit 120 may be awakened when an application or other circuit needs to use the downstream circuit 120. When the switches 632(1)-632(M) are implemented using PMOS switches, the power-up signal may comprise a low-voltage signal (logic zero) since driving the gates of the PMOS switches low turns on the PMOS switches.

At time t0, the power-up signal turns on the first switch 632(1) to power up the first section 310(1). The first delay element 650(1) delays the power-up signal by a first time delay, and outputs the power-up signal to the second delay element 650(2) and the second switch 632(2) at time t1. Thus, the output of the first delay element 650(1) turns on the second switch 632(2) after the first time delay from time t0. The first time delay may be approximately equal to the settling time for the voltages at the upstream circuit 115 and the first section 310(1).

The second delay element 650(2) delays the power-up signal by a second time delay, and outputs the power-up signal to the third delay element (not shown in FIG. 6) and the third switch 632(3) at time t2. Thus, the output of the second delay element 650(2) turns on the third switch 632(3) after the second time delay. The second time delay may be approximately equal to the settling time for the voltages at the upstream circuit 115 and the first and second sections 310(1) and 310(2).

In general, each delay element 650(1)-650(M−1) delays the power-up signal by the time delay of the delay element. Thus, the output of each delay element 650(1)-650(M−1) turns on the respective switch 632(2)-632(M) after a time delay from the time that the previous switch was turned on, where the time delay is approximately equal to the time delay of the delay element. The time delay of each delay element 650(1)-650(M−1) may be approximately equal to the settling time for the voltages at the upstream circuit 115 and the previous sections.

The output of the last delay element 650(M−1) may be coupled to the power-gate controller 645, in which case, the power-up signal returns to the power-gate controller 645 after propagating through the delay elements 650(1)-650(M−1). In this embodiment, the power-gate controller 645 may treat the return of the power-up signal as an indication that the sections 310(1)-310(M) of the downstream circuit 120 have been powered up.

In one embodiment, the downstream circuit 120 may comprise a memory that can be divided into power-gated sections of varying sizes. For example, the memory may comprise a large number of bit lines, in which each section 310(1)-310(M) comprises a subset of the bit lines. In this example, power to each bit line may be controlled by a separate switch. This provides a circuit designer with the flexibility of selecting the number of bit lines in each section, and hence the size of each section. The larger the number of bits lines in a section, the larger the size of the section.

The size of each section may be selected from a plurality of different sizes, where each size corresponds to a different number of bit lines. In this example, when a size for a section is determined (e.g., based on equation (3) or (6)), a circuit designer may select a size from the plurality of sizes that is closest to the determined size for the section. If the closest size is larger than the determined size, then the circuit designer may select the closest size that is less than the determined size to ensure that the voltage-droop constraint is met.

Figure 7:
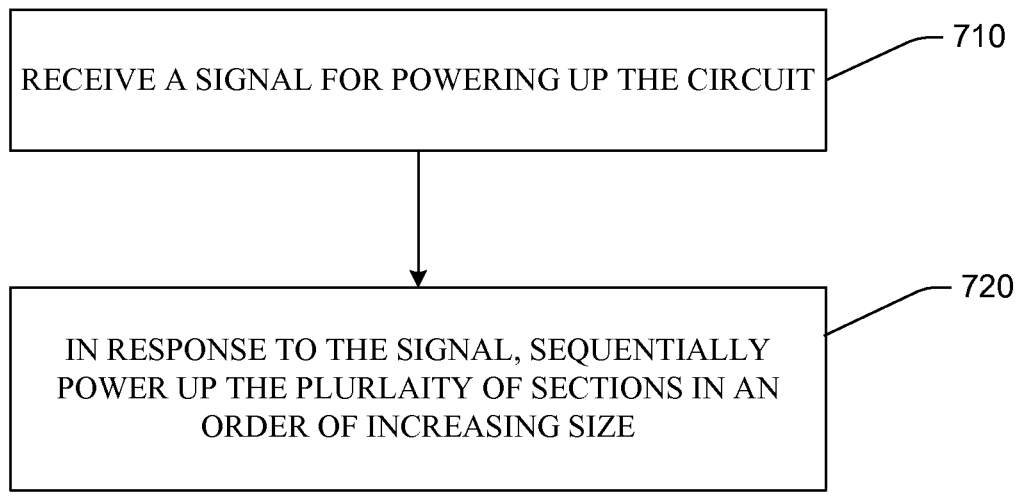
FIG. 7 is a flow diagram showing a method for sequentially powering up sections of a circuit according to an embodiment of the present disclosure.

FIG. 7 shows a method 700 for powering up a circuit comprising a plurality of sections of progressively increasing size according to an embodiment of the present disclosure.

In step 710, a signal for powering up the circuit is received. For example, the signal may comprise a power-up signal output by a power-gate controller (e.g., power-gate controller 645).

In step 720, in response to the signal, the sections are sequentially powered up in an order of increasing size. For example, the power-up signal may propagate down a delay chain (e.g., delay chain 625) that sequentially turns on switches (e.g., switches 632(1)-632(M)) connecting the sections (e.g., 310(1)-310(M)) to a power supply (e.g., power supply 110).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for sizing power-gated sections in a downstream circuit, the method comprising:
   determining a capacitance for a first section based on a capacitance of an upstream circuit, and a voltage-droop constraint;
   determining a capacitance for a second section based on the capacitance of the upstream circuit, the voltage-droop constraint, and the determined capacitance for the first section;
   determining a capacitance for a third section based on the capacitance of the upstream circuit, the voltage-droop constraint, and the determined capacitances for the first and second sections; and
   determining a size for each of the first, second and third sections based on the determined capacitance for each of the sections.

2. The method of claim 1, wherein the downstream circuit comprises a memory.

3. The method of claim 1, wherein determining the capacitance for the second section comprises determining the capacitance for the second section based on a sum of the capacitance of the upstream circuit, and the determined capacitance for the first section.

4. The method of claim 3, wherein determining the capacitance for the third section comprises determining the capacitance for the third second section based on a sum of the capacitance of the upstream circuit, the determined capacitance for the first section, and the determined capacitance for the second section.

5. The method of claim 1, wherein determining the size for each of the first, second and third sections comprises dividing the determined capacitance for each of the sections by a capacitance density.

6. The method of claim 1, wherein determining the capacitance for the first section comprises determining the capacitance for the first section based on a correction factor.

7. The method of claim 6, wherein the correction factor has a value of at least 0.8.

8. The method of claim 1, wherein the voltage-droop constraint is approximately 0.05 or less.

9. A method for powering up a circuit comprising a plurality of sections of progressively increasing size, the method comprising:
   receiving a signal for powering up the circuit; and
   in response to the signal, sequentially powering up the plurality of sections in an order of increasing size.

10. The method of claim 9, wherein the plurality of sections have different capacitances, and sequentially powering up the plurality of sections comprises sequentially powering up the plurality of sections in an order of increasing capacitance.

11. The method of claim 9, wherein the circuit comprises a memory divided into the plurality of sections.

12. The method of claim 9, wherein each of the plurality of sections is selectively connected to a power rail by a separate switch, and sequentially powering up the plurality of sections comprises sequentially closing the switches.

13. The method of claim of claim 12, wherein sequentially closing the switches comprises:
   closing the switch for a first one of the plurality of sections; and
   after a time delay, closing the switch for a second one of the plurality of sections, wherein the time delay is equal to or longer than a settling time of a voltage ripple on the power rail triggered by the closure of the switch for the first one of the plurality of sections.

14. An apparatus for powering up a circuit comprising a plurality of sections of progressively increasing size, the apparatus comprising:
   means for receiving a signal for powering up the circuit; and
   means for sequentially powering up the plurality of sections in an order of increasing size in response to the signal.

15. The apparatus of claim 14, wherein the plurality of sections have different capacitances, and the means for sequentially powering up the plurality of sections comprises means for sequentially powering up the plurality of sections in an order of increasing capacitance.

16. The apparatus of claim 14, wherein the circuit comprises a memory divided into the plurality of sections.

17. The apparatus of claim 14, wherein each of the plurality of sections is selectively connected to a power rail by a separate switch, and the means for sequentially powering up the plurality of sections comprises means for sequentially closing the switches.

18. The apparatus of claim 17, wherein the means for sequentially closing the switches comprises:
    means for closing the switch for a first one of the plurality of sections; and
    means for closing, after a time delay, the switch for a second one of the plurality of sections, wherein the time delay is equal to or longer than a settling time of a voltage ripple on the power rail triggered by the closure of the switch for the first one of the plurality of sections.

19. An apparatus for powering up a circuit comprising a plurality of sections of progressively increasing size, the apparatus comprising:
    a plurality of switches, wherein each of the switches is configured to selectively connect a respective one of the sections to a power rail; and
    a power management device configured to sequentially close the switches such that the switches sequentially power up the plurality of sections in an order of increasing size.

20. The apparatus of claim 19, wherein the plurality of sections have different capacitances, and the power management device is configured to sequentially close the switches such that the switches sequentially power up the plurality of sections in an order of increasing capacitance.

21. The apparatus of claim 19, wherein the circuit comprises a memory divided into the plurality of sections.

22. The apparatus of claim 19, wherein the power management device comprises:
    a plurality of delay elements coupled in series to form a delay chain, wherein each switch is coupled to a different point along the delay chain; and
    a power-gate controller configured to output a power-up signal to the delay chain if the circuit is to be powered up from an inactive state.

23. The apparatus of claim 22, wherein each of the switches comprises one or more P-type metal-oxide-semiconductor (PMOS) transistors, and the power-up signal is a low-voltage signal.

24. The apparatus of claim 23, wherein a time delay of one of the delay elements is equal to or longer than a settling time of a voltage ripple on the power rail triggered by a closure of one of the switches.

25. The method of claim 9, wherein the plurality of sections comprises at least three sections.

26. The method of claim 10, wherein the plurality of sections comprises at least three sections.

27. The apparatus of claim 14, wherein the plurality of sections comprises at least three sections.

28. The apparatus of claim 15, wherein the plurality of sections comprises at least three sections.

29. The apparatus of claim 19, wherein the plurality of sections comprises at least three sections.

30. The apparatus of claim 20, wherein the plurality of sections comprises at least three sections.

* * * * *